United States Patent
McReynolds et al.

(10) Patent No.: US 7,069,952 B1
(45) Date of Patent: Jul. 4, 2006

(54) MICROFLUIDIC DEVICES AND METHODS OF THEIR MANUFACTURE

(75) Inventors: Richard J. McReynolds, San Jose, CA (US); David Chazan, Palo Alto, CA (US)

(73) Assignee: Caliper Life Sciences, Inc., Mountain View, CA (US)

( * ) Notice: Subject to any disclaimer, the term of this patent is extended or adjusted under 35 U.S.C. 154(b) by 395 days.

(21) Appl. No.: 10/292,816

(22) Filed: Nov. 12, 2002

Related U.S. Application Data (60) Provisional application No. 60/332,661, filed on Nov. 14, 2001.

(51) Int. Cl.
*F15C 1/06* (2006.01)
*F16K 31/00* (2006.01)

(52) U.S. Cl. ...................... 137/833; 251/368
(58) Field of Classification Search ............... 137/833; 251/368
See application file for complete search history.

(56) References Cited

U.S. PATENT DOCUMENTS

| | | | |
|---|---|---|---|
| 3,548,849 A | 12/1970 | Purcell et al. | |
| 3,568,692 A * | 3/1971 | Metzger et al. | ............. 137/827 |
| 3,587,615 A | 6/1971 | Thomson | |
| 3,731,700 A | 5/1973 | Cohen | |
| 3,747,628 A | 7/1973 | Holster et al. | |
| 3,811,474 A | 5/1974 | Bauer et al. | |
| 5,147,606 A | 9/1992 | Charlton et al. | |
| 5,250,263 A | 10/1993 | Manz | |
| 5,286,624 A | 2/1994 | Terashima et al. | |
| 5,325,889 A | 7/1994 | Paul et al. | |
| 5,512,131 A | 4/1996 | Kumar et al. | |
| 5,534,328 A | 7/1996 | Ashmead et al. | |
| 5,585,069 A | 12/1996 | Zanzucchi et al. | |
| 5,757,482 A | 5/1998 | Fuchs et al. | |
| 5,846,396 A | 12/1998 | Zanzucchi et al. | |
| 5,885,470 A | 3/1999 | Parce et al. | |
| 5,993,750 A | 11/1999 | Ghosh et al. | |
| 6,074,725 A * | 6/2000 | Kennedy | ..................... 428/188 |
| 6,136,272 A | 10/2000 | Weigl et al. | |
| 6,167,910 B1 | 1/2001 | Chow | |
| 6,224,830 B1 | 5/2001 | Harrison et al. | |
| 6,319,472 B1 | 11/2001 | Ackley et al. | |
| 6,321,791 B1 * | 11/2001 | Chow | ......................... 137/833 |
| 6,346,305 B1 | 2/2002 | Ramsey et al. | |
| 6,418,968 B1 | 7/2002 | Pezzuto et al. | |

FOREIGN PATENT DOCUMENTS

| | | |
|---|---|---|
| WO | WO-9702357 | 1/1997 |
| WO | WO-9816315 | 4/1998 |
| WO | WO-9824544 | 6/1998 |
| WO | WO-9919717 | 4/1999 |
| WO | WO-0060352 | 10/2000 |
| WO | WO-0125137 | 4/2001 |
| WO | WO-0125138 | 4/2001 |
| WO | WO-0211888 | 2/2002 |
| WO | WO-0230560 | 4/2002 |

* cited by examiner

*Primary Examiner*—A. Michael Chambers
(74) *Attorney, Agent, or Firm*—Donald R. McKenna; Ann C. Petersen (57) ABSTRACT

The present invention provides multi-layered microfluidic devices comprising an interface layer between every two substrate layers. The interface layer simplifies the manufacturing process of the multi-layered devices because the interface may comprise a material suitable for etching whereby manufacturing of these devices is simplified to a great extent.

The invention also provides methods of manufacturing the multi-layered devices wherein the devices may comprise substrates composed of non-similar materials that are bonded together by anodic bonding.

32 Claims, 4 Drawing Sheets

MICROFLUIDIC DEVICES AND METHODS OF THEIR MANUFACTURE

CROSS REFERENCE TO RELATED APPLICATIONS

This application claims the benefit of U.S. Provisional Patent Application No. 60/332,661 filed Nov. 14, 2001, which is incorporated herein by reference in its entirety for all purposes. This application is also related to U.S. Ser. No. 09/231,209, filed Jan. 14, 1999, which issued as U.S. Pat. No. 6,167,910B1 on Jan. 2, 2001, and is also related to currently pending application U.S. Ser. No. 60/269,174, filed Feb. 15, 2001.

BACKGROUND OF THE INVENTION

Microfluidic devices are becoming increasingly popular for a wide variety of applications. The popularity of these devices is attributed to the cost effectiveness and the feasibility of using these devices for varied chemical and biochemical applications. In particular, the small size and automatability of these microfluidic systems provides a variety of advantages in terms of low reagent consumption, low space requirements, shorter reaction times, and integratability. Multilayer, microfluidic devices offer even more advantages over conventional systems because several analyses can be performed simultaneously in multiple channel networks disposed within the multiple layers of the devices.

Most microfluidic devices are laminates consisting of two or more substrate layers bonded together. Multi-layered microfluidic devices contain three or more substrate layers. The networks of channels through which fluids flow in a multi-layered microfluidic device are disposed between the three or more substrate layers of the device. The elements that form the networks, such as grooves, wells and the like, may be formed in one or both of the surfaces that form the intersection between each pair of conjoined substrate layers in a multi-layer microfluidic device. These elements define the various microfluidic aspects or structures of the overall microfluidic device, including channels, chambers and the like.

Often holes need to be drilled in the bonded substrates to create reservoirs or ports for reagent addition. This is most often a time consuming, tedious and expensive process. It is therefore generally desirable to have a manufacturing method that does not require the mechanical drilling of holes in bonded substrates.

Further, because of the small scale of these devices, as well as the highly precise nature of the operations they perform, the manufacturing of these microfabricated devices requires extremely high levels of precision in order to accurately and reliably reproduce the various microscale features of the devices.

The present invention addresses these needs by providing improved multi-layered microfluidic devices with components that greatly simplify their manufacture.

SUMMARY OF THE INVENTION

The present invention is generally directed to improved microfluidic devices and methods of their manufacture. In accordance with the invention, there is provided multi-layered microfluidic devices including interface layers and methods of their use.

In one aspect the invention provides microfluidic devices having a body structure including at least two substrate layers and an interface layer or middle layer disposed between the two substrate layers. In this aspect, the interface layer comprises a material different than the two top and bottom substrate layers and includes at least one fluid passage whereby the fluid passage provides fluid communication between the at least two substrate layers. The devices include at least first and second microscale channel networks disposed within the body structure. The first channel network is typically disposed between the first substrate layer and the interface layer. The second channel network is typically disposed between the second substrate layer and the interface layer. The devices of the invention also include at least first, second and third ports disposed in the body structure.

In a preferred arrangement, the interface layer may be formed of silicon, tungsten or molybdenum. Optionally, the interface layer may be of the same material as that of the two substrate layers. In another aspect, the interface layer may optionally have a very small thickness making it suitable for etching. In one embodiment the interface layer may have a thickness between about 10 μm to 250 μm. The body structure of the devices further includes a plurality of chambers or reservoirs disposed within the body structure serve to provide fluid communication within the various channel networks.

In another aspect, the devices comprise small vias or holes that can serve multiple functions in various uses of the devices. In one aspect, a via provides a detection pathway for detecting properties of materials flowing through the channel networks in a given channel region. Optionally, the vias may be used to align a detection system over a detection region of a channel within the microchannel networks of a device. In other aspects, a via provides a fluid connection between channel networks disposed within the multiple layers of the device.

The methods of the invention are directed to improved techniques for manufacturing multi-layered microfluidic devices having ports or vias with very small diameters. In preferred aspects, the methods provide etching the holes that will form the ports or vias in the substrate or interface layers prior to bonding the several layers of the device together.

The present invention also includes systems incorporating these microfluidic devices, which systems typically include a material transport system, operably linked to each of the ports of the device for selectively controlling movement of material in the plurality of channel networks of the device.

BRIEF DESCRIPTION OF THE DRAWINGS

FIGS. 2A and 2B illustrate an embodiment of a multi-layered device in accordance with the invention.

DETAILED DESCRIPTION

The devices, systems and methods of the current invention directly address the problems associated with the manufacture of multi-layered microfluidic devices. Briefly, the present invention provides devices comprising multiple layers wherein at least one interface layer is disposed between every two substrate layers. The presence of an interface layer provides for a simplified manufacturing process by providing an ability to etch microscale fluid passages through the interface layer prior to bonding the substrate layers together. The current invention differs from previous methods and devices in numerous ways. For example, embodiments of the current invention utilize readily etchable materials such as silicon and tungsten to form an interface layer between two substrate layers. The use of etchable materials that can be bonded to other materials by methods such as anodic bonding allows for the formation of small vias or holes in the interface layers by etching before the interface layers are bonded to the top and bottom substrate layers. The vias/holes function as fluid pathways between the various microscale channel networks situated in the body structure of a completed device.

The present invention also provides methods of manufacturing the multi-layered microfluidic devices of the invention. In preferred aspects, the substrate layers in a multi-layer microfluidic device are separated by thin interface layers. Microfluidic elements are preformed on the various substrate layers before the substrate layers are bonded to the interface layers. The invention further provides systems that incorporate the multi-layer microfluidic devices with other components such as material transport systems, detection and quantification devices, and robotic devices for positioning of components.

Multi-layered microfluidic devices can be manufactured by bonding together three or more planar substrate layers. Microfluidic elements, such as grooves, wells and depressions, are generally formed on the planar surfaces of the substrate layers before the layers are bonded together. The substrates can be etched using methods employed in the semiconductor industry. While those methods are suitable for etching microscale features, those methods do not etch substrate materials rapidly enough to be able to etch through the entire thickness of a substrate layer in a reasonable amount of time. Consequently, holes that extend through the entire thickness of a substrate layer, which can form reservoirs or ports for the introduction of fluids into the microfluidic elements, are usually created by drilling through a substrate layer before the substrate layers are bonded together to form the multi-layer microfluidic device. Mechanical drilling of holes in substrates is often a time consuming, tedious and expensive process, especially when the substrates are made of glass. Often, manufacturing yields are low due to breakage of substrates or drill bits during the drilling process. Further, mechanical drilling of holes results in a long manufacturing turn around time.

In contrast, the present invention provides for placing etchable interface layers between the substrate layers in a multi-layer microfluidic device. Accordingly, many of the holes that form the ports or vias in a multi-layer microfluidic device that are embodiments of this invention can be etched through the interface layer before the interface layer is bonded to its adjacent substrate layers. Since the interface layer is made of a material that can be etched, conventional etching methods known in the semiconductor industry can be used. Etching holes in the interface layer instead of mechanically drilling holes in the substrate layers can result in significant cost savings. Furthermore, known etching processes typically provide better dimensional control than mechanical drilling. The improved dimensional control allows for the manufacture of holes with extremely small diameters, and for the reduction of dead volume between interface layers and the substrate layers to which they are bonded.

The present invention also provides additional flexibility in configuring the elements of microfluidic devices. For example, the vias or ports in an interface layer can be configured to provide a sufficient path length for the detection of the absorbance or fluorescence of light. Accordingly, embodiments of the invention can be used in applications involving ultraviolet absorbance detection schemes.

One of the other advantages of multi-layered microfluidic devices in accordance with the invention is the ability to have different ports extend through different numbers of layers, thus making it possible to selectively introduce fluids to different channel networks formed on different substrate layers. The ability to selectively introduce fluids into the various channel networks within a multi-layer microfluidic device allows multiple distinct channel networks to operate on a single multi-layer device. These multiple distinct networks can physically overlap one another, but still function as separate units because they are separated from each other by at least one interface layer. The ability to have overlapping networks enables the manufacture of microfluidic devices with smaller cross sectional areas.

The body structure of the microfluidic devices described herein typically comprises an aggregation of at least three layers, which when appropriately mated or joined together, form a microfluidic device in accordance with the invention. Such a microfluidic device could, for example, contain the multiple channel networks. Typically, embodiments of the invention comprise at least three layers: a bottom substrate layer, a middle interface layer and a top substrate layer. In one aspect, the middle interface layer will comprise a material having surface properties that render it suitable for etching by standard etching techniques, such as wet chemical etching. One of the advantages of this invention then, is that fluid pathways can be etched into the middle layer prior to the bonding of the substrates thereby overcoming the need to mechanically drill holes through bonded substrates.

In some aspects the microfluidic devices of the present invention will include more than four, five, six, seven, eight or more layers, depending upon the nature of the operation for which the device is to be used. In preferred aspects, the devices of the invention further provide having interface layers between every two substrate layers.

As used herein, the term "microscale" or "microfabricated" generally refers to structural elements or features of a device that have at least one fabricated dimension in the range of from about 0.1 µm to about 500 µm. Thus, a device referred to as being microfabricated or microscale will include at least one structural element or feature having such a dimension. When used to describe a fluidic element, such as a passage, chamber or conduit, the terms "microscale," "microfabricated" or "microfluidic" generally refer to one or more fluid passages, chambers or conduits which have at least one internal cross-sectional dimension, e.g., depth, width, length, diameter, etc., that is less than 500 µm, and typically between about 0.1 µm and about 500 µm. In the devices of the present invention, the microscale channels or chambers preferably have at least one cross-sectional dimension between about 0.1 µm and 200 µm, more preferably between about 0.1 µm and 100 µm, and often between about 1 µm and 20 µm. Accordingly, the microfluidic devices or systems prepared in accordance with the present invention typically include at least one microscale channel, usually at least two intersecting microscale channels, and often, three or more intersecting channels disposed within a single body structure. Channel intersections may exist in a number of formats, including cross intersections, "T" intersections, or any number of other structures whereby two channels are in fluid communication.

As used herein, the terms "substrate" or substrate layer" are used interchangeably to refer to solid planar substrates having first and second opposing, or substantially parallel, planar surfaces. A variety of substrate materials may be employed as the various layers of the device. Typically, because the devices are microfabricated, substrate materials will be selected based upon their compatibility with known microfabrication techniques, e.g., photolithography, wet chemical etching, laser ablation, air abrasion techniques, injection molding, embossing and other techniques. The substrate materials are also generally selected for their compatibility with the full range of conditions to which the microfluidic devices may be exposed, including extremes of pH, temperature, salt concentration, and application of electric fields. Substrates are also generally selected for their electrokinetic properties, e.g., surface potential, thermal and optical properties, e.g., transparency etc. Accordingly, in some preferred aspects, the substrate material may include materials normally associated with the semiconductor industry in which such microfabrication techniques are regularly employed, including, e.g., silica based substrates, such as glass, quartz, silicon or polysilicon, as well as other substrate materials, such as gallium arsenide and the like.

In additional preferred aspects, the substrate materials will comprise polymeric materials, e.g., plastics, such as polymethylmethacrylate (PMMA), polycarbonate, polytetrafluoroethylene (TEFLON), polyvinylchloride (PVC), polydimethylsiloxane (PDMS), polysulfone, and the like. Such polymeric substrates are readily manufactured using available microfabrication techniques, as described above, or from microfabricated masters, using well known molding techniques, such as injection molding, embossing or stamping, or by polymerizing the polymeric precursor material within the mold (See U.S. Pat. No. 5,512,131). Such polymeric substrate materials are preferred for their ease of manufacture, low cost and disposability, as well as their general inertness to most extreme reaction conditions. Again, these polymeric materials may include treated surfaces, e.g., derivatized or coated surfaces, to enhance their utility in the microfluidic system, e.g., provide enhanced fluid direction, e.g., as described in U.S. patent application Ser. No. 08/843,212, filed Apr. 14, 1997, which has issued as U.S. Pat. No. 5,885,470, and which is incorporated herein by reference in its entirety for all purposes.

Previously described multi-layered microfluidic devices generally comprise three bonded layers of a substrate material wherein a microscale channel network is disposed between every two layers of the body structure and a plurality of ports are in fluid communication with the microscale channel networks. In contrast, the devices of the present invention comprise at least one layer that forms an interface between two layers of substrate material. The interface layer may optionally comprise a similar material as the top and bottom layers or may comprise a material different than the top and bottom layers. Preferably, the interface material comprises a material that is readily etchable. An "interface" layer as described herein, generally includes, a material that may be anisotropically etched to form fluid passages to connect the microfluidic elements of the surrounding layers. In preferred embodiments, the interface layer comprises a thickness of no greater than 250 microns. In another aspect, the interface layer is preferably silicon, tungsten, or molybdenum.

As noted above, the various layers of the microfluidic devices are mated or bonded together to form the microfluidic elements of the device. Bonding of the layers is generally carried out under any of a number of methods or conditions known in the art. Conditions under which layers may be bonded together are generally widely understood, and such bonding can be carried out by any of a number of methods, which may vary depending upon the nature of the substrate materials used. For example, thermal bonding may be applied to a variety of materials, including glass or silica based materials, as well as polymers. Such thermal bonding typically comprises mating together the layers that are to be bonded, under conditions of elevated temperature and, in some cases, application of external pressure. The precise temperatures and pressures will generally vary depending upon the nature of the materials being bonded. For example, for silica-based materials, i.e., glass (borosilicate glass, Pyrex, soda lime glass, etc.), quartz, and the like, thermal bonding of layers is typically carried out by pressing the layers together at temperatures ranging from about 500° C. to about 1400° C., and preferably, from about 500° C. to about 1200° C. For example, soda lime glass is typically bonded at temperatures around 550° C., whereas borosilicate glass typically is thermally bonded at or near 800° C. Quartz layers, on the other hand, are typically thermally bonded at temperatures at or near 1200° C. These bonding temperatures are typically achieved by placing the layers to be bonded into high temperature annealing ovens. These ovens are generally commercially available from manufacturers such as Fischer Scientific, Inc., and LabLine, Inc.

In a first embodiment, the layers are bonded together by anodic bonding. As is well known in the art, anodic bonding is a preferred method for bonding micromechanical device components because it is a low temperature process (300° C. to 450° C.) and can be used for bonding dissimilar materials. Although anodic bonding is typically used to bond silicon to glass, it may also be used to bond other types of materials. In devices wherein the interface layer is made up of a different material than the top and bottom substrate layers, anodic bonding is the preferred method of bonding. Anodic bonding may also be used to bond similar materials. Anodic bonding differs from thermal bonding because unlike thermal bonding, a lower temperature is used in combination with applying a voltage to form and strengthen a bond between two layers.

Optionally, bonding of substrate and interface layers may be achieved by gluing the layers together. In embodiments employing interface layers made of silicon or glass in combination with top and bottom substrates made of quartz or other similar materials, the bonding of the various layers may optionally be achieved by gluing the layers together at room temperature. Gluing the multiple layers at room temperature offers additional benefits. For instance, the microscale elements of the device may be pretreated with a protective coating prior to bonding the substrates comprising the micro-scale elements. Pre-treating surfaces is described in detail in U.S. Pat. No. 6,326,083, which is incorporated by reference in its entirety herein for all purposes.

Figure 1:
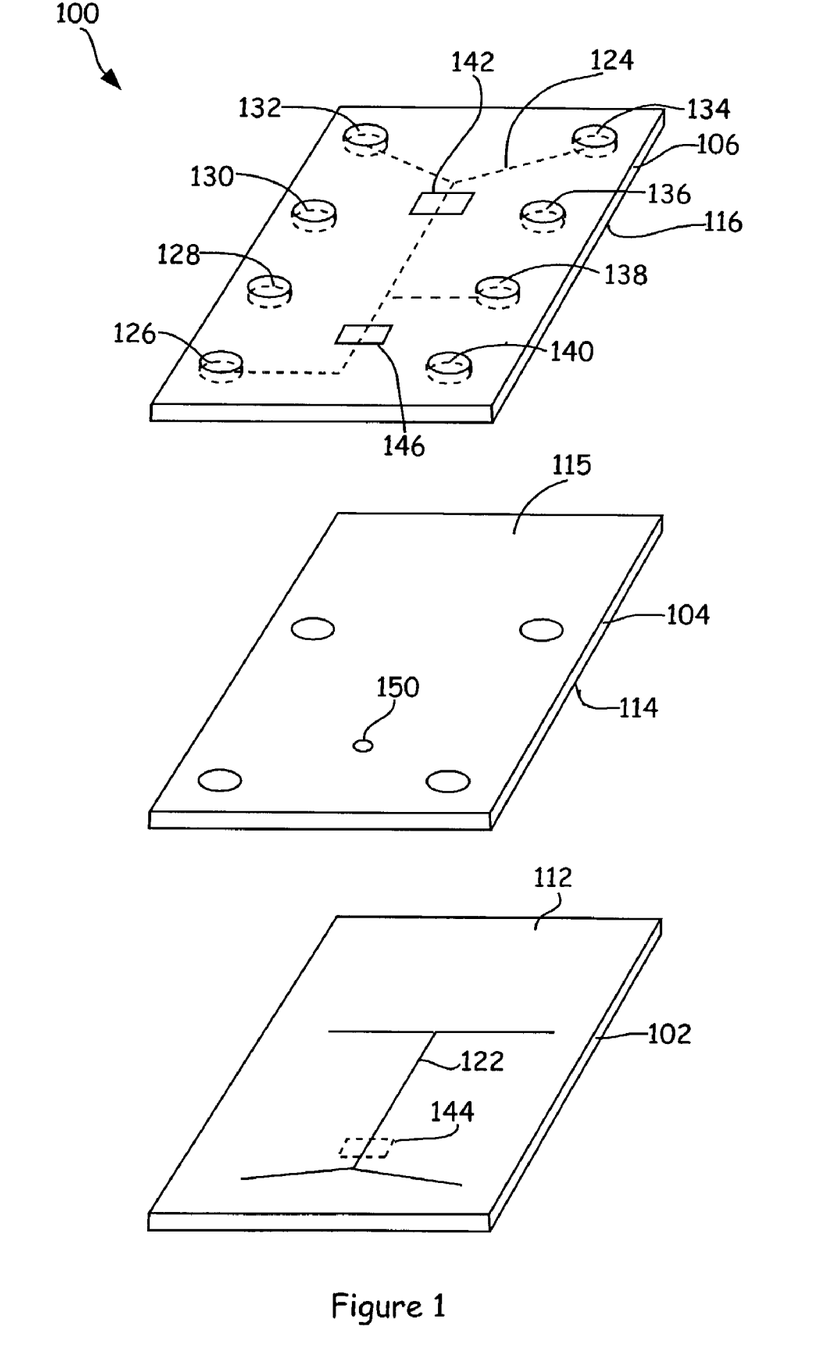
FIG. 1 illustrates the layered fabrication of a typical multi-layered microfluidic device, from at least three substrates comprising an interface layer, which substrates are mated together to define the microfluidic elements of the device.

FIG. 1 illustrates a microfluidic device incorporating an embodiment of the present invention. As shown, the device 100 includes a top substrate layer 106, a bottom substrate layer 102 and an interface layer 104. Bottom substrate 102 includes a top surface 112, which is mated with the bottom surface 114 of the interface layer 104. The top surface 115 of the interface layer 104 is likewise mated with the bottom surface 116 of the top substrate 106. A first channel network 122 is fabricated into the top surface 112 of the bottom substrate 102, as a series of grooves. A similar series of grooves is fabricated into the bottom surface 116 of the top substrate 106, to form a second channel network 124. Upon mating the top surface 112 of the bottom substrate 102 with the bottom surface 114 of the interface layer 104, these grooves form the channels of the device. Alternatively, the channel network 122 is optionally fabricated onto the bottom surface 114 of the interface layer 104. Upon mating with the bottom substrate 102, the channels of the device are formed.

A plurality of ports can also be provided through the substrate layers of the device, to provide access to the various channel networks. In embodiments of the present invention, each of the channel networks of the devices is in fluid communication with at least two ports or reservoirs disposed in the body of the device. In preferred aspects, at least one port is common to, in other words in simultaneous fluid communication with, two or more channel networks, while at least one port is typically specific to a single channel network. In order to be common to multiple channel networks in the multi-layered devices of the invention, a port must traverse multiple substrate layers. An example of this port structure is illustrated in FIG. 1. For example, ports 126 and 130 are apertures disposed through upper substrate 106 and interface layer 104, providing access to and fluid communication with both channel network 124 and channel network 122. Meanwhile, port 134 is shown disposed through only the top substrate 106, whereupon it is in fluid communication only with channel network 124. Port 136 on the other hand is disposed through top substrate 106 and interface layer 104, but oriented at a position in the substrate such that it only provides access to, and is in fluid communication with only channel network 122. This is a result of channel network 124 not extending to and intersecting port 136.

In some embodiments of the invention, the interface layer 104 comprises ports that are not fluid passages but rather serve as a path for a detection signal. These provide access to a detection region present in the channel networks. For example, as illustrated in FIG. 1 port 150 in the interface layer 104, coincides with detection region 144 in channel network 122. During operation of the device, a detector is positioned over detection window 146 in the top substrate 106, in order to detect a signal in detection region 144.

The channels of the device are fabricated first as grooves in a first planar surface of one of the substrates. Fabrication techniques often depend upon the types of substrates used. For example, silica based substrates are generally fabricated using photolithographic techniques followed by wet chemical etching of the grooves into the surface of the substrate. Polymeric substrates, on the other hand, can have the grooves embossed into the planar substrate surface, or molded into the surface using, for example, injection-molding techniques. Other techniques, such as LIGA, laser ablation, micro machining, and the like can also be employed. The multiple layers are then stacked, aligned and bonded together to seal the grooves as the enclosed channels of the device. A variety of different channel geometries can be effectively generated using these techniques, in order to accomplish a variety of different operations.

Fabrication of the ports/via may also be carried out by a number of methods. For example, in the case of polymeric substrates, the vias or ports may be molded into the substrates. One of the more common ways of fabricating via/ports in multi-layered devices has been by either laser ablation or mechanical drilling through the substrates. For example, in the case of silica-based substrates such as quartz or glass, the vias may be drilled through the substrates using similar techniques as used in the fabrication of the channel networks. In one aspect, the devices of the present invention provide a simpler and cost effective method of fabricating the ports/via into layers of the device. The method provides using a thin interface layer, wherein the interface layer is preferably of a material that is easily etchable. For example, materials that are suitable for etching include silicon, metals such as molybdenum, tungsten, and stainless steel. The thickness of the interface layer is generally within the range of 25 μm to 250 μm. In preferred embodiments, the interface layer is less than 150 μm thick. In more preferred embodiments, the interface layer is less than 100 μm thick and in even more preferred embodiments it is less than or equal to 25 μm thick. In certain cases, it may be preferred to employ a silicon substrate as the interface layer. This allows for etching ports/via of very small diameters into the interface layer. Specifically, as a monocrystalline substrate, silicon allows a straighter etch path through it, as compared to a broadening etch pattern from the isotropic etching of other substrates such as glass and quartz, where etching extends laterally outward from the etched surface, as well as into the etched surface. Therefore, use of silicon permits the etching of an extremely small via through the interface layer, for example, as small as 10 μm diameter.

Figure 2A:
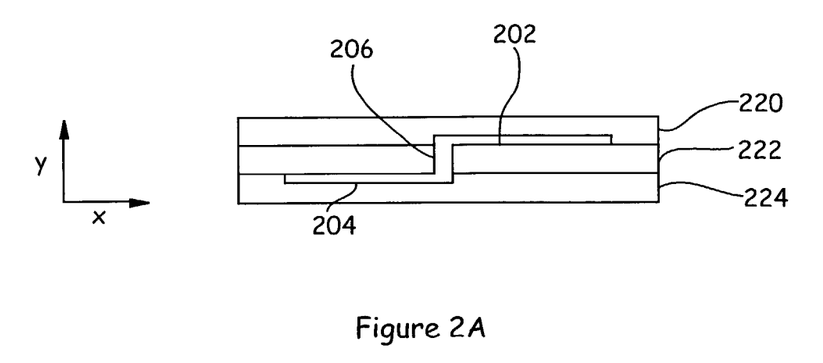
FIG. 2A illustrates a side view of the device, which has a via in the interface layer providing fluid communication between two channel networks.
Figure 2B:
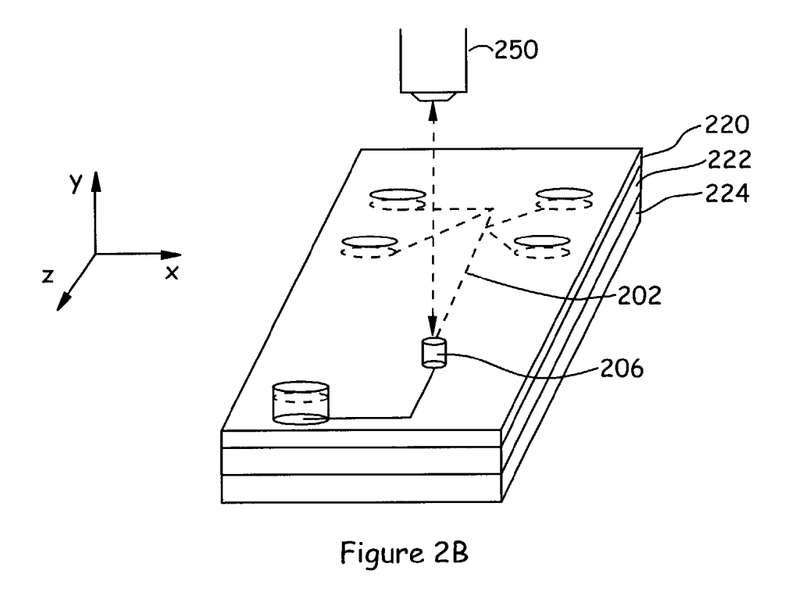
FIG. 2B is a perspective view of the same device.

Devices embodying the present invention can provide enhanced ability to perform parallel analyses on a single material placed into a single microfluidic device. In other words, embodiments of the invention can facilitate the conversion of a single stream of material, which may contain several components serially flowing down the single stream, to parallel flows of the components. The multi-layer microfluidic devices of the present invention also permit greater freedom in constructing channel networks. Specifically, such multi-layer devices include channels or channel networks that bridge other channels or channel networks by detouring from one layer of the device to the other. Thus, in addition to providing multi-layer microfluidic devices in which channel networks on different layers are in fluid communication via common ports, the present invention also provides devices that include fluid passages disposed through the interface layer, in order to provide fluid communication between channels or channel networks disposed in different layers of the device. Because these passages are intended for fluid transport, rather than fluid introduction, they will generally have a substantially smaller diameter. Smaller port diameters help in minimizing dead volumes within the device and thereby improve overall efficiency of the systems. For example, the ports for fluid introduction will generally range in diameter from about 0.5 mm to about 10 mm, and preferably from about 1 mm to about 5 mm, the fluid passages disposed through the interface layer and/or the substrates will, on the other hand, typically range from about 30 μm to about 500 μm in diameter, and preferably will be fabricated to a similar cross section as the channels with which the passages communicate. FIGS. 2A and 2B illustrate a fluid passage 206 in fluid communication with channel 202 in a first channel network and channel 204 in a second channel network.

In addition to providing fluid access and/or storage for the channel networks of the device, the ports of the device also typically provide access for the material direction and transport systems, which move and direct materials and/or fluids through the various channel networks of the device. As noted above, movement of materials in the channel networks of the devices may be achieved by applying pressure. Pressure based material transport systems typically operate by applying a pressure differential from one end of a channel, through which material movement is desired, to the other end of the channel. By applying appropriate pressures across intersecting channels, one can control material direction through the intersections of channels, and in and out of chambers (see, e.g., Published PCT Application No. WO97/02357). Typically, controlled pressures are applied to the ports of the microfluidic device, which ports are in communication with the channel networks.

In preferred aspects, material transport systems are a combination of a pressure controller system, which could include a pressure or vacuum source applied to one or more ports in the channel network, as well as a channel network configuration that is optimized to yield a particular flow profile under the applied pressure differentials in the system. For example, in some preferred cases, a single vacuum source is applied to one port in a microfluidic channel network. Relative flow rates of materials in all the various channels are then controlled by the designed flow resistance of the channels of the device. In alternate methods, multiple pressure and/or vacuum sources are applied to a plurality of different ports of the device to regulate pressure differentials across different channels of the device at different times to control the flow profiles within the device. Such multiport pressure controllers are described in U.S. Patent Application No. 60/216,793, filed Jul. 7, 2000, and incorporated herein by reference in its entirety for all purposes.

The systems described herein generally include microfluidic devices, as described above, in conjunction with additional instrumentation. The additional instrumentation typically includes power supplies and controllers, for controlling fluid transport and direction within the devices, as described in greater detail below. The instrumentation also typically includes detection instrumentation for detecting or sensing results of the operations performed by the system. Further, the instrumentation often includes processor instrumentation, such as computers, for instructing the controlling instrumentation in accordance with preprogrammed instructions, receiving data from the detection instrumentation, and for analyzing, storing and interpreting the data, and providing the data and interpretations in a readily accessible reporting format. A variety of controlling instrumentation may be utilized in conjunction with the microfluidic devices described above to control the transport and direction of fluids and/or materials within the devices of the present invention, in accordance with the systems described above. Typically, such controllers incorporate the driving system for the material transport systems, such as electrical power sources or pressure sources. The controller also typically includes an appropriate interface component, for interfacing the microfluidic device with the transport driving system.

A variety of detection methods and systems may be employed, depending upon the specific operation that is being performed by the system. Often, a microfluidic system will employ multiple different detection systems for monitoring the output of the system. Examples of detection systems include optical sensors, temperature sensors, electrochemical sensors, pressure sensors, pH sensors, pressure sensors, pH sensors, conductivity sensors, and the like. Each of these types of sensors is readily incorporated into the microfluidic systems described herein. In these systems, such detectors are placed either within or adjacent to the microfluidic device or one or more channels, chambers or conduits of the device, such that the detector is within sensory communication with the device, channel or chamber. In preferred aspects, the devices of the present invention typically include one or more detection windows, for detecting the progress and/or results of a particular operation being performed within the device. As used herein, the term "detection window" refers to a region on the body of a microfluidic device that is capable of transmitting a detectable signal from one or more microfluidic channels of the device to the exterior of the device, where it can be readily detected, for example, by a detector disposed adjacent to the detection window.

Figure 3:
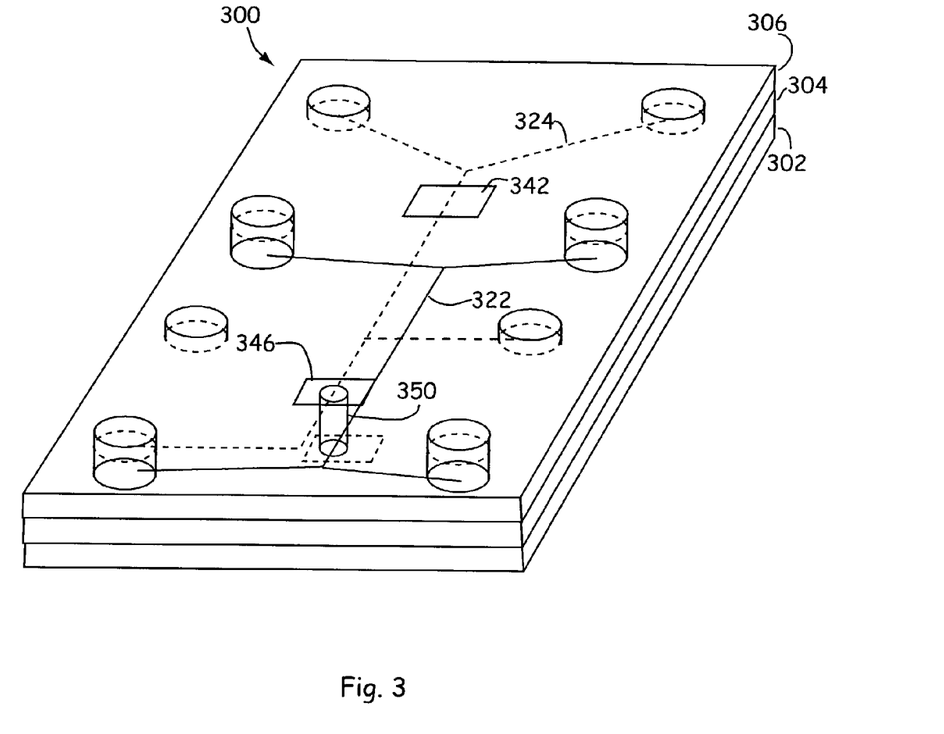
FIG. 3 illustrates an embodiment of a microfluidic device comprising top and bottom substrate layers and an interface layer of a material different than the top and bottom substrate layers.

FIG. 3 illustrates the orientation of the multiple detection windows on the body of the device 300, which incorporates at least two separate channel networks, and two detection windows 342 and 346. One detection window 342 is in sensory communication with the uppermost channel network 324, while the other detection window is in sensory communication with both the upper 324 and lower 322 channel networks. Although, it is preferred to have separate detection windows for separate channel structures, it is not required. As shown in FIG. 3, a single detection window can be used where two channel networks overlay each other, or are in close proximity to each other, but produce readily distinguishable signals such as light and radiation or emitted fluorescence at different wavelengths. In preferred aspects, the detection windows are optical detection windows, permitting the transmission of an optical signal from one or more channels or channel networks to the exterior of the device, for detection by an appropriately positioned optical detector.

EXAMPLE

One example of use of the multi-layered devices comprising an interface layer is a device for measuring the Ultraviolet absorbance of an analyte. In one aspect, the present invention provides microfluidic devices that are especially suitable for spectroscopic applications. FIGS. 2A and 2B illustrate an embodiment of a microfluidic device in accordance with this invention wherein the interface layer 222 is made of a material that completely blocks, by absorbing or reflecting light. For example, silicon or glass could be used to block UV light. Use of such a material provides the benefit of directing incident light to pass through a preselected portion of the sample without requiring that directing apertures be formed or affixed on the top and bottom substrate layers, 220 and 224 respectively. In the embodiment in FIGS. 2A and 2B, a via 206 forming a detection path can be etched through the thickness of the interface layer 222 prior to bonding the interface layer 222 with the top and bottom substrates, 220 and 224, respectively. Channel segments, 202 and 204 are in fluid communication with via 206. The detection path length is a function of the thickness of the interface layer 222. Therefore, the length of the detection channel is defined by the thickness of the interface layer. For example, in case of glass, the thickness can be as high as 10 mm. In operation, an UV absorbance detector 250 is oriented substantially perpendicular to the planar body structure of the device. The detector 250 is oriented to direct and receive UV light through the entire length of detection channel segment via 206.

Example 1

UV Absorption of Fluorescein Labeled 25-mer of DNA

Figure 4:
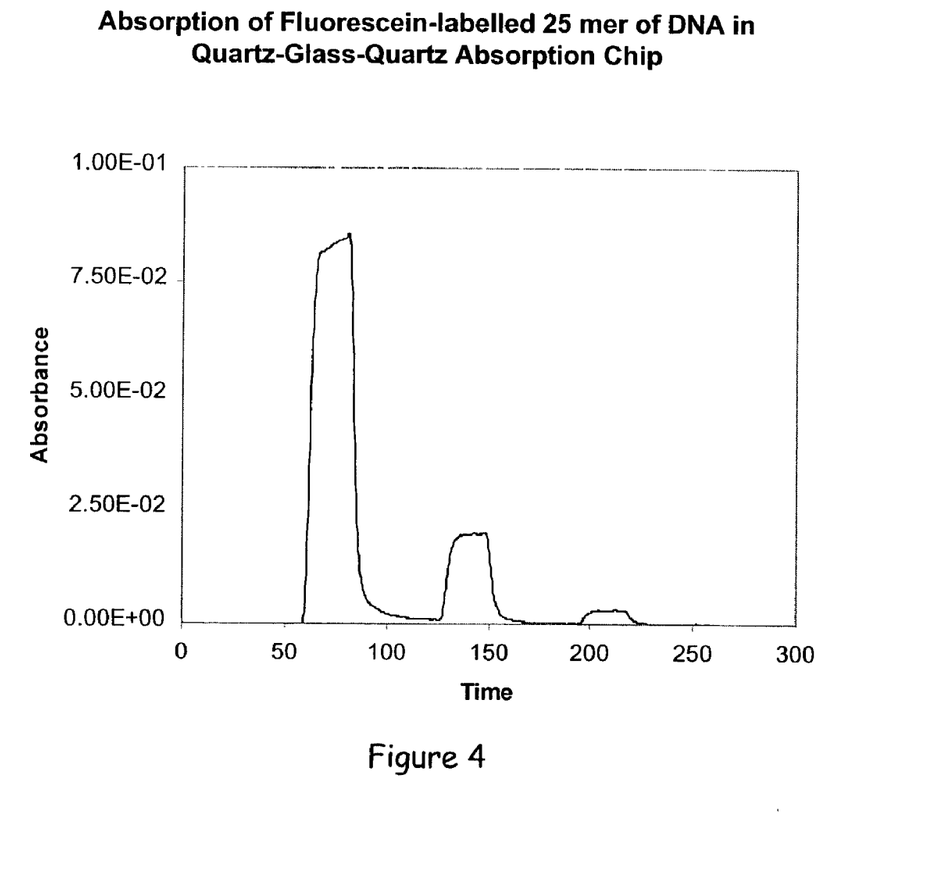
FIG. 4 show absorbance data generated by an embodiment of the invention.

A microfluidic system employing a device with top and bottom layers of fused silica and a glass interface layer was used for determining the UV absorbance of three different concentrations of fluorescein labeled 25-mer of DNA. A pressure driven material transport system was employed for transporting the fluids within the channels of the device. The pressure was applied to a waste reservoir of the device to draw fluids through the channels. The three different concentrations of the 25-mer of DNA were 5 μM, 1 μM and 0.2 μM. A 20 second injection of each of the samples was made. A 45 second injection of water was made before and after each sample injection. Absorbance was measured at 254 nm using a UV detector positioned proximal to a detection channel segment. The absorbance data is shown in FIG. 4. As illustrated in the plot, one can readily distinguish concentration differences from the relative absorbance of the different sample plugs as detected in the system of the invention.

Although the present invention has been described in some detail by way of illustration and example for purposes of clarity and understanding, it will be apparent that certain changes and modifications may be practiced within the scope of the appended claims. All publications, patents and patent applications referenced herein are hereby incorporated by reference in their entirety for all purposes as if each such publication, patent or patent application had been individually indicated to be incorporated by reference.

What is claimed is:

1. A method of manufacturing a multilayer microfluidic device, comprising:
   providing multiple substrate layers of a first material;
   providing at least one interface layer of a second material;
   microfabricating microfluidic elements into said multiple substrates of a first material;
   microfabricating holes or via into said at least one interface layer of the second material;
   anodically bonding said layers to form a body structure whereby said at least one substrate of a second material forms an interface between said multiple substrate layers of the first material.

2. A microfluidic device, comprising:
   a body structure comprising at least first and second substrate layers, wherein each of the first and second substrate layers comprise at least first and second microscale channel networks therein, an interface layer disposed between said first and second substrate layers, the interface layer being of a material different than each of the at least first and second substrate layers;
   at least one fluid passage disposed through the interface layer, said fluid passage providing fluid communication between the at least first and second microscale channel networks.

3. The microfluidic device of claim 2, wherein the interface layer is formed from a material selected from the group consisting of silicon, tungsten, and molybdenum.

4. The microfluidic device of claim 2, wherein the interface layer has a thickness less than 250 μm.

5. The microfluidic device of claim 2, wherein the interface layer has a thickness between 25 to 250 μm.

6. The microfluidic device of claim 2, wherein the interface layer has a thickness of at least 50 μm.

7. The microfluidic device of claim 2, wherein each of the at least first and second substrates is independently selected from the group of silicon, glass, quartz and polymeric substrates.

8. The microfluidic device of claim 2, wherein each of the first and second channel networks comprises at least two intersecting microscale channels.

9. The microfluidic device of claim 2, wherein at least one of the first and second channel networks comprises at least three intersecting channels.

10. The microfluidic device of claim 2, further comprising at least a first detection window disposed over a channel in at least one of the first and second channel networks.

11. The microfluidic device of claim 10, further comprising at least a second detection window, the first detection window being disposed over a channel in the first channel network and the second detection window being disposed over a channel in the second channel network.

12. The microfluidic device of claim 2, further comprising at least first and second ports disposed in the body structure, each of the first and second ports being in fluid communication with at least one of the first and second channel networks.

13. The microfluidic device of claim 12, wherein the first and second ports are in fluid communication with the first channel network.

14. The microfluidic device of claim 12, wherein the first port is in fluid communication with the first channel network and the second port is in fluid communication with the second channel network.

15. The microfluidic device of claim 12, further comprising a third port disposed in the body structure, the third port being in fluid communication with at least one of the first and second channel networks.

16. The microfluidic device of claim 12, wherein the first and second ports are in fluid communication with the first channel network.

17. The microfluidic device of claim 12, wherein the first port is in fluid communication with the first channel network and the second port is in fluid communication with the second channel network.

18. The microfluidic device of claim 12, further comprising a third port disposed in the body structure, the third port being in fluid communication with at least one of the first and second channel networks.

19. The microfluidic device of claim 2, wherein at least one channel in the first or second channel network comprises a separation matrix disposed therein.

20. A microfluidic device, comprising:
   a body structure comprising at least first and second substrate layers, wherein each of the substrate layers comprises an upper planar surface and a lower planar surface; at least one interface layer, said interface layer having an upper planar surface and a lower planar surface, and further said interface layer being disposed between the at least first and second substrate layers; the interface layer comprising a thickness of no greater than 250 μm;
   at least first and second microscale channel networks, elements of the first channel network being formed in the first substrate layer and elements of the the second channel network being formed in the second substrate layer; and
   at least one fluid passage disposed through the interface layer providing fluid communication between the first channel network and the second channel network.

21. The microfluidic device of claim 20, wherein the interface layer is formed from a material selected from the group consisting of silicon, tungsten, and molybdenum.

22. The microfluidic device of claim 20, wherein the interface layer has a thickness less than 50 μm.

23. The microfluidic device of claim 20, wherein the interface layer has a thickness between 25 to 250 μm.

24. The microfluidic device of claim 20, wherein the interface layer as a thickness of at least 50 μm.

25. The microfluidic device of claim 20, wherein each of the at least first and second substrates is independently selected from the group of silicon, glass, quartz and polymeric substrates.

26. The microfluidic device of claim 20, wherein each of the first and second channel networks comprises at least two intersecting microscale channels.

27. The microfluidic device of claim 20, wherein at least one of the first and second channel networks comprises at least three intersecting channels.

28. The microfluidic device of claim 20, further comprising at least a first detection window disposed over a channel in at least one of the first and second channel networks.

29. The microfluidic device of claim 28, further comprising at least a second detection window, the first detection window being disposed over a channel in the first channel network and the second detection window being disposed over a channel in the second channel network.

30. The microfluidic device of claim 20, further comprising at least first and second ports disposed in the body structure, each of the first and second ports being in fluid communication with at least one of the first and second channel networks.

31. The microfluidic device of claim 20, wherein at least one channel in the first or second channel network comprises a separation matrix disposed therein.

32. A microfluidic device comprising:
   a body structure comprising at least first, second and third layers wherein the second layer is made of a material different than the first and third layers, each of the first, second and third layers comprising a top planar surface and a bottom planar surface, and the second substrate layer disposed between the first and the third substrate layers;
   at least first and second microscale channel networks, the first channel network disposed between the first and second layers, and the second channel network disposed between the second and third layers, wherein the first channel network is microfabricated in the bottom surface of the first substrate layer, and the second channel network is fabricated in the top surface of the third substrate layer;
   at least first, second and third ports disposed within the body structure, wherein each of the first and second channel networks is in fluid communication with at least one of the at least first, second and third ports; and
   at least one fluid passage disposed through the second layer providing fluid communication between the first channel network and the second channel network.

* * * * *